(12) United States Patent
Baldo et al.

(10) Patent No.: US 10,048,148 B2
(45) Date of Patent: Aug. 14, 2018

(54) PROCESS FOR MANUFACTURING A MEMS PRESSURE SENSOR, AND CORRESPONDING MEMS PRESSURE SENSOR

(71) Applicant: STMICROELECTRONICS S.R.L., Agrate Brianza (IT)

(72) Inventors: Lorenzo Baldo, Bareggio (IT); Sarah Zerbini, Fontanellato (IT); Enri Duqi, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/276,617

(22) Filed: Sep. 26, 2016

(65) Prior Publication Data

US 2017/0284882 A1    Oct. 5, 2017

(30) Foreign Application Priority Data

Mar. 31, 2016 (IT) .......................... 102016000033308

(51) Int. Cl.
| | |
|---|---|
| G01P 15/08 | (2006.01) |
| H01L 21/00 | (2006.01) |
| G01L 9/00 | (2006.01) |
| B81B 3/00 | (2006.01) |
| B81B 7/00 | (2006.01) |
| B81C 1/00 | (2006.01) |

(52) U.S. Cl.
CPC .......... G01L 9/0052 (2013.01); B81B 3/0021 (2013.01); B81B 7/0006 (2013.01); B81C 1/00158 (2013.01); *B81B 2201/0264* (2013.01)

(58) Field of Classification Search
CPC ...................................................... G01L 9/0052
USPC ........................................... 257/417; 438/51
See application file for complete search history.

(56) References Cited

U.S. PATENT DOCUMENTS

| | | | |
|---|---|---|---|
| 9,114,976 B1 * | 8/2015 | Cheng | .................. B81B 7/0054 |
| 2005/0208696 A1 * | 9/2005 | Villa | ..................... G01L 9/0073 |
| | | | 438/53 |

(Continued)

FOREIGN PATENT DOCUMENTS

| | | |
|---|---|---|
| EP | 1 324 382 B1 | 3/2007 |
| EP | 2 423 157 A2 | 2/2012 |

*Primary Examiner* — Igwe U Anya
(74) *Attorney, Agent, or Firm* — Seed Intellectual Property Law Group LLP (57) ABSTRACT

A process for manufacturing a MEMS pressure sensor having a micromechanical structure envisages: providing a wafer having a substrate of semiconductor material and a top surface; forming a buried cavity entirely contained within the substrate and separated from the top surface by a membrane suspended above the buried cavity; forming a fluidic-communication access for fluidic communication of the membrane with an external environment, set at a pressure the value of which has to be determined; forming, suspended above the membrane, a plate region made of conductive material, separated from the membrane by an empty space; and forming electrical-contact elements for electrical connection of the membrane and of the plate region, which are designed to form the plates of a sensing capacitor, the value of capacitance of which is indicative of the value of pressure to be detected. A corresponding MEMS pressure sensor having the micromechanical structure is moreover described.

18 Claims, 7 Drawing Sheets

(56) References Cited

U.S. PATENT DOCUMENTS

| | | | |
|---|---|---|---|
| 2008/0015494 A1* | 1/2008 | Santini, Jr. | A61M 5/1409 |
| | | | 604/65 |
| 2010/0158280 A1* | 6/2010 | Coronato | B81B 3/0072 |
| | | | 381/174 |
| 2011/0165717 A1* | 7/2011 | Lee | B81B 7/0061 |
| | | | 438/50 |
| 2012/0042731 A1 | 2/2012 | Lin et al. | |
| 2012/0043627 A1 | 2/2012 | Lin et al. | |
| 2013/0001710 A1* | 1/2013 | Daneman | H01L 23/10 |
| | | | 257/415 |
| 2015/0061049 A1* | 3/2015 | Weber | G01L 1/148 |
| | | | 257/417 |
| 2015/0224784 A1* | 8/2015 | Hong | B41J 2/16535 |
| | | | 347/47 |
| 2016/0122181 A1* | 5/2016 | Picco | B81B 7/0058 |
| | | | 257/419 |
| 2016/0370242 A1* | 12/2016 | Duqi | G01L 9/0054 |

* cited by examiner

PROCESS FOR MANUFACTURING A MEMS PRESSURE SENSOR, AND CORRESPONDING MEMS PRESSURE SENSOR

BACKGROUND

Technical Field

The present disclosure relates to a process for manufacturing a MEMS (Micro-ElectroMechanical Systems) pressure sensor and to a corresponding MEMS pressure sensor.

Description of the Related Art

Integrated semiconductor pressure sensors made using micromachining techniques, typical of MEMS, are known.

These sensors are, for example, used within portable or wearable electronic apparatuses, or in the automotive field, for example, for barometric applications.

In particular, piezoresistive pressure sensors are known, whose operation is based on piezoresistivity, i.e., on the capacity of some materials to modify their resistivity as the mechanical stresses to which they are subjected vary. For instance, the resistivity decreases when compressive stresses are applied, whereas it increases when tensile stresses are applied.

Piezoresistive pressure sensors generally include a membrane (or diaphragm), which is suspended over a cavity provided in a body of semiconductor material and undergoes deformation in the presence of incident pressure waves coming from the external environment.

Piezoresistive elements (generally constituted by implanted or diffused doped regions) are provided in a surface region of the membrane and are electrically connected to one another in Wheatstone-bridge configuration.

Deformation of the membrane causes an unbalancing of the Wheatstone bridge, which can be detected by a purposely provided electronic circuit (coupled to the micromechanical structure of the sensor), the so-called ASIC (Application-Specific Integrated Circuit), which derives, from said unbalancing, the value of pressure acting on the membrane.

Even though these piezoresistive pressure sensors are used widely and successfully, the present Applicant has realized that they have some disadvantages, at least for certain applications.

In particular, the present Applicant has realized that this type of sensors has in general a non-linear response as a function of temperature, i.e., a high thermal coefficient (TCO). The detection sensitivity moreover is dependent on the temperature and generally deteriorates as temperature increases.

Consequently, use of these sensors for applications that envisage high operating temperatures, or in general extensive temperature variations, may not be advisable.

The manufacturing process is moreover rather complex and costly, on account of the need for several implant or diffusion masks, for example to obtain the doped regions for formation of the piezoresistive elements within the membrane.

Furthermore, these piezoresistive pressure sensors do not allow convenient implementation of self-test procedures, for testing proper functionality thereof during operation.

In this regard, it is known that in some contexts of application, for example, in the automotive field, the self-testing capability is expressly desired to electronic systems in order to prevent errors and failure.

BRIEF SUMMARY

According to the present disclosure, a process for manufacturing a MEMS pressure sensor and a corresponding MEMS pressure sensor are provided.

For instance, in one embodiment there is provided a process for manufacturing a MEMS pressure sensor. The process includes forming a buried cavity in a substrate of semiconductor material. The buried cavity forms a membrane that is suspended above the buried cavity. The process further includes forming, suspended above the membrane, a plate region made of conductive material. The plate region is separated from the membrane by an empty space. The process also includes forming a fluidic-communication access channel providing fluidic communication between the membrane and an external environment. The process also including forming electrical-contact elements configured to electrically couple the membrane and the plate region. The membrane and the plate region form plates of a sensing capacitor.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 2b is a schematic cross-sectional view corresponding to the top plan view of FIG. 2a;

DETAILED DESCRIPTION

Figure 1:
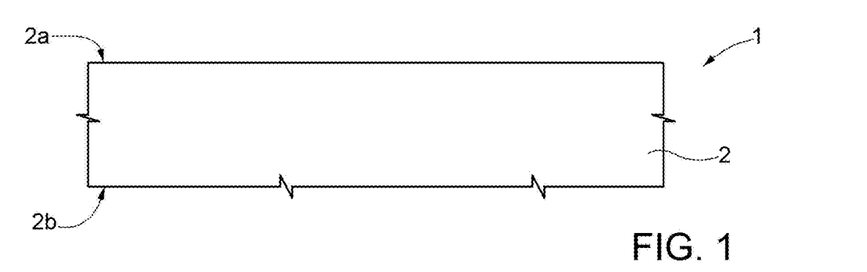
FIG. 1 is a schematic cross-sectional view of a micromechanical structure of a MEMS pressure sensor, according to a first embodiment of the present solution, in an initial step of a corresponding manufacturing process.

With initial reference to FIG. 1, a manufacturing process is now described for manufacturing a MEMS pressure sensor of a capacitive type, according to one embodiment of the present solution.

In an initial step of the manufacturing process, a wafer 1 of semiconductor material, for example, monocrystalline silicon, is provided, including a substrate 2, for example with n-type (or equivalently p-type) doping, and having a front surface 2a and a rear surface 2b.

The manufacturing process proceeds with formation of a buried cavity completely contained within the wafer 1, overlaid by a membrane, with techniques described in detail, for example, in EP 1 324 382 B1 filed in the name of the present Applicant, which is incorporated herein by reference.

Figure 2A:
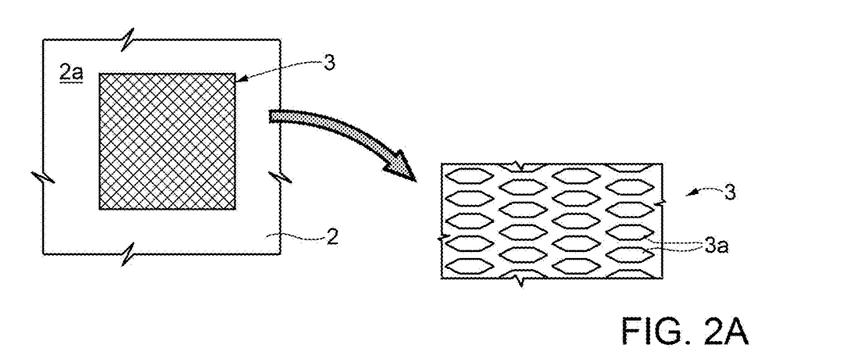
FIG. 2a is a schematic top plan view of the micromechanical structure in a subsequent step of the manufacturing process.
Figure 2B:
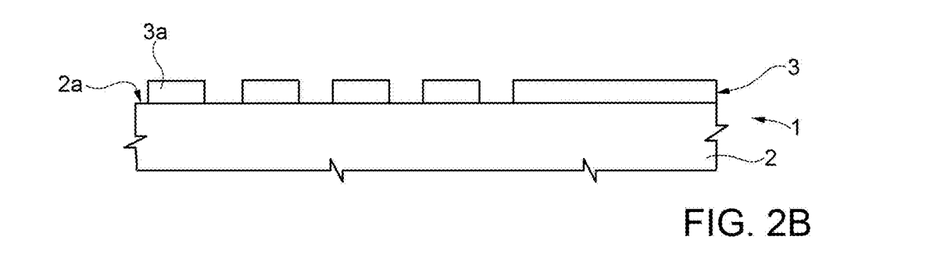

As illustrated in FIGS. 2a and 2b (which are not drawn to scale, as likewise the remaining figures), a first etching mask 3 is provided on the front surface 2a of the substrate 2, made, for example, of photosensitive material, the so-called "photoresist".

The first etching mask 3 defines (see the enlarged detail of FIG. 2a) an etching area, which in the example is approximately square (but may be another shape, such as circular, generically polygonal or any other suitable shape), and comprises a plurality of mask portions 3a, for example, hexagonal, which define a lattice, for example, a honeycomb lattice.

As will be evident in what follows, the etching area of the first etching mask 3 corresponds to the area that will be occupied by the buried cavity and has an extension corresponding to the extension of the membrane that will be formed over the same buried cavity.

Figure 3:
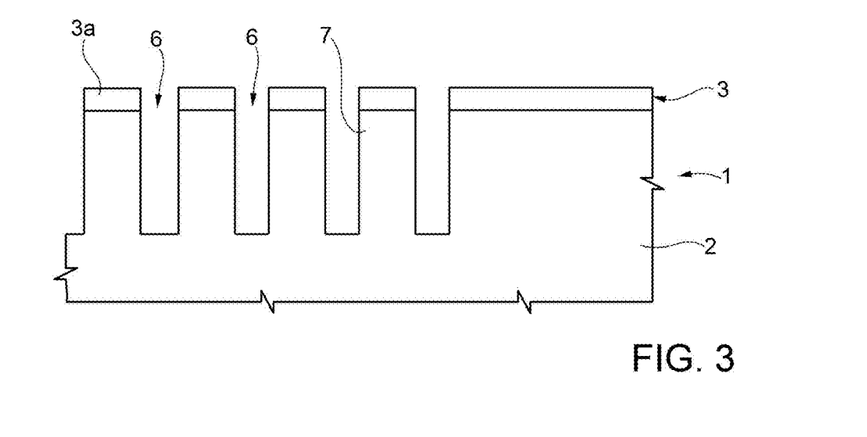
FIGS. 3-9 are schematic cross-sectional views of the micromechanical structure in subsequent steps of the manufacturing process.

With reference to FIG. 3, which, like FIG. 2b, represents only an enlarged portion of the wafer 1, for reasons of clarity of illustration, using the first etching mask 3, an anisotropic chemical etching of the substrate 2 is carried out, following upon which trenches 6 are formed, which communicate with one another and delimit a plurality of columns 7, made of silicon.

In practice, the trenches 6 form an open region of a complex shape (corresponding to the lattice of the first etching mask 3) extending in which are the columns 7 (of a shape corresponding to the mask portions 3a).

The first etching mask 3 is removed and an epitaxial growth is carried out in deoxidizing environment (typically, in atmosphere with high hydrogen concentration, preferably with trichlorosilane—$SiHCl_3$). Consequently, an epitaxial layer grows above the columns 7 and closes the aforesaid open region formed by the trenches 6 at the top.

A step of thermal annealing is carried out, for example, for 30 minutes at 1190° C., preferably in reducing atmosphere, typically in hydrogen atmosphere. The annealing step causes a migration of the silicon atoms, which tend to move into a position of lower energy. Consequently, and also due to the short distance between the columns 7, the silicon atoms migrate completely from the portions of the columns 7 present within the aforesaid open region formed by the trenches 6, and, starting from said region, a buried cavity 10 is formed.

Figure 4:
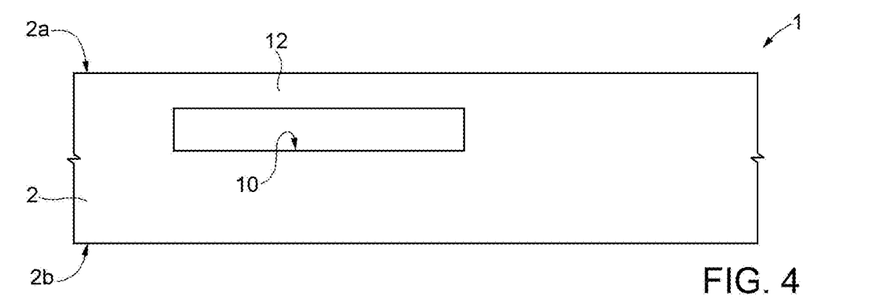

As shown in FIG. 4 (which represents an enlarged portion of the wafer 1, as compared to that of FIGS. 2b and 3), a thin silicon layer remains above the buried cavity 10, constituted in part by silicon atoms grown epitaxially and in part by migrated silicon atoms, and forming a membrane 12, which is flexible and is able to deflect in the presence of external stresses.

In particular, the membrane 12 separates the buried cavity 10 from the top surface 2a of the substrate 2. The same buried cavity 10 is separated from the rear surface 2b by a thick monolithic region of the substrate 2.

Advantageously, during the steps for formation of the membrane 12 and the buried cavity 10, dopant atoms may be introduced within the substrate 2 and in the same membrane 12, so as to increase conductivity thereof.

At the end of the manufacturing process steps that have been described previously, the buried cavity 10 is hence formed within the substrate 2, completely contained within the substrate 2, being separated both from the front surface 2a and from the rear surface 2b of the substrate 2 by continuous portions of material. In yet other words, the buried cavity 10 has no fluidic communication with the outside of the substrate 2.

Figure 5:
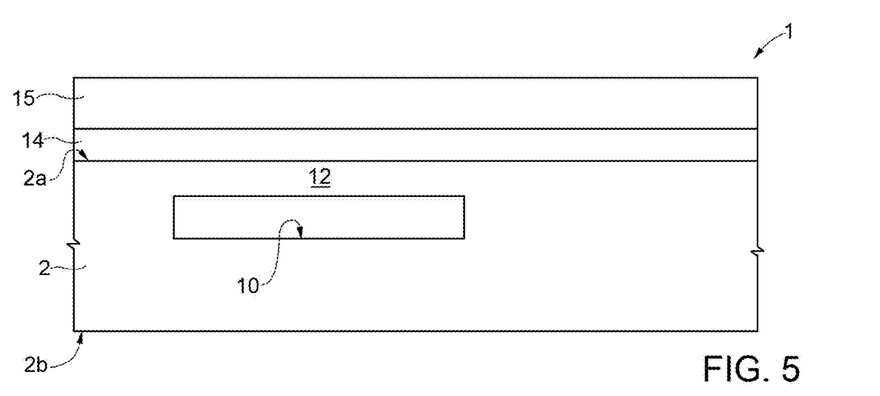

As shown in FIG. 5, the manufacturing process proceeds with the formation on the top surface 2a of the substrate 2, and hence on the membrane 12, of a sacrificial layer 14, made, for example, of dielectric material, such as silicon oxide. This sacrificial layer 14 may, for example, be formed by means of deposition techniques over the entire wafer 1 (the so-called "blank deposition", without the use of masks).

A conductive layer 15 is formed on the sacrificial layer 14, for example made of polysilicon. In this embodiment, the conductive layer 15 is grown epitaxially on the sacrificial layer 14 (once again without the use of masks).

Figure 6:
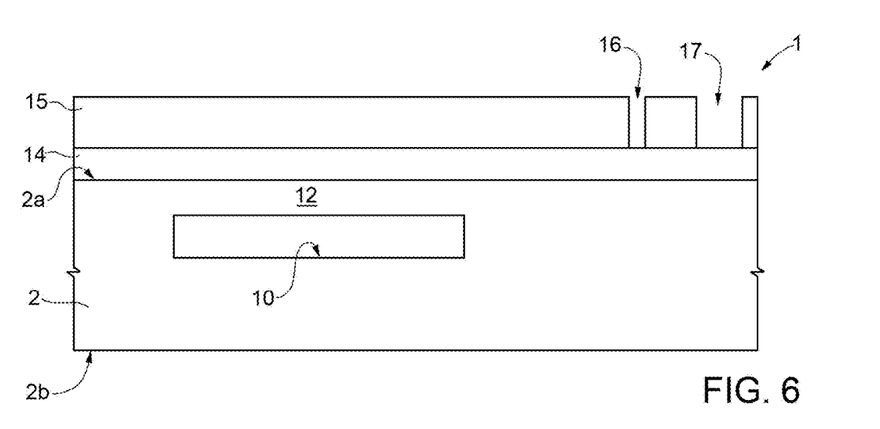

With reference to FIG. 6, through a second etching mask (not shown herein), an etching of the conductive layer 15 is carried out, with etch-stop on the sacrificial layer 14, leading to removal of material and to formation of a first pad trench 16 and of a contact opening 17, both of which traverse the conductive layer 15 throughout its thickness. The contact opening 17 is set laterally alongside the first pad trench 16, in a more external position with respect to the membrane 12.

Figure 7:
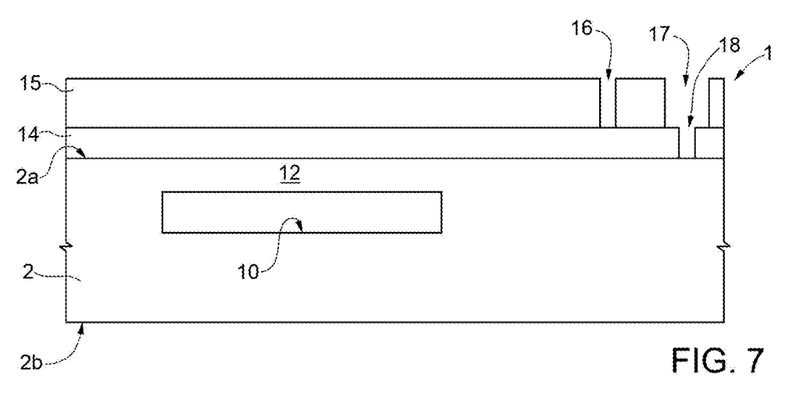

With reference to FIG. 7, the second etching mask is removed and a third etching mask (here not illustrated) is formed above the conductive layer 15, through which an etching of the sacrificial layer 14 is carried out with etch-stop on the substrate 2, thus removing a portion of the same sacrificial layer 14 vertically at the contact opening 17, so as to form a second pad trench 18.

The second pad trench 18 hence terminates on the top surface 2a of the substrate 2 and is set alongside the first pad trench 16, in a position laterally more external with respect to the membrane 12.

Figure 8:
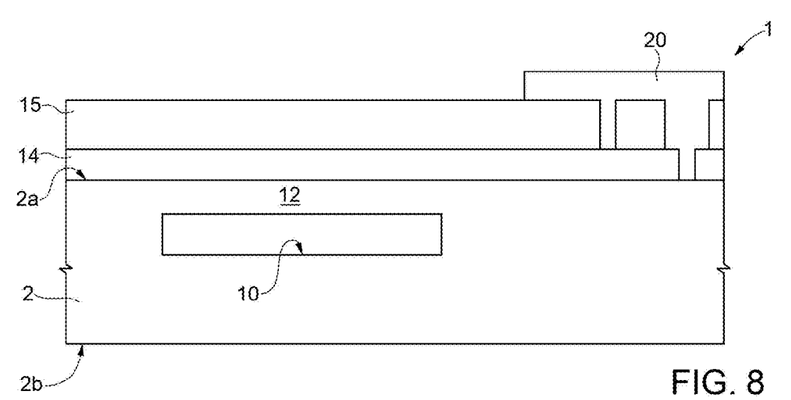

With reference to FIG. 8), the third etching mask is removed, and a deposition mask (here not illustrated) is formed on the conductive layer 15, which coats the conductive layer 15 at an area vertically corresponding to the membrane 12 and instead leaves exposed the first and second pad trenches 16, 18.

Using this deposition mask, a metal region 20, of an appropriate metal material, for example, aluminum (or gold), is deposited on the conductive layer 15.

In particular, this metal region 20 fills the first and second pad trenches 16, 18 completely, as illustrated in FIG. 8, coming into contact with the top surface 2a of the substrate 2 within the second pad trench 18, and with the sacrificial layer 14 within the first pad trench 16.

Figure 9:
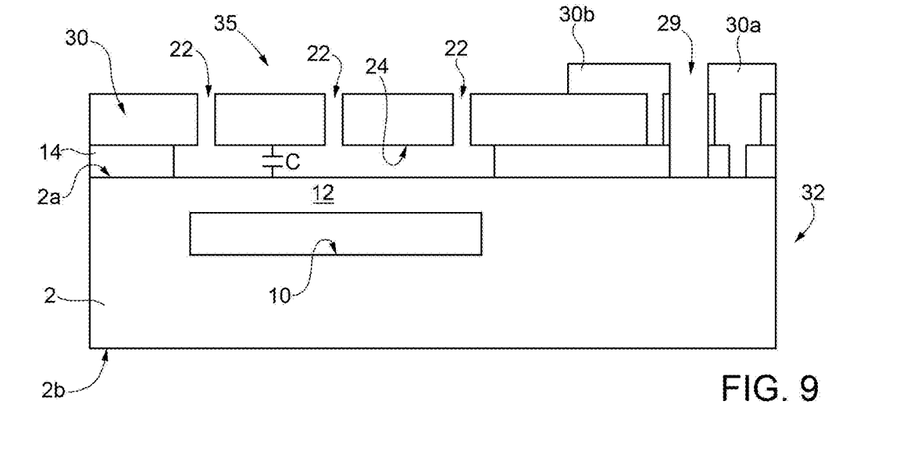

With reference to FIG. 9, a fourth etching mask (here not illustrated) is formed on the conductive layer 15 and the metal region 20, through which an etching is carried out, with etch-stop first on the sacrificial layer 14, which leads to removal of material and formation of a plurality of holes 22, which traverse the conductive layer 15 throughout its thickness vertically in a position corresponding to the membrane 12 (for example, the holes 22, of a through type, are formed according to a lattice arrangement, as will be illustrated hereinafter).

Etching, for example a chemical wet etching, proceeds in the underlying sacrificial layer 14 through the holes 22, with etch-stop on the top surface 2a of the substrate 2, leading to removal of the material of the sacrificial layer 14 and to formation of an empty space 24, above the membrane 12.

In particular, this empty space 24 sets in fluidic communication the membrane 12 with the external environment, via the holes 22 that pass through the conductive layer 15. The holes 22 have in fact a first end 22a, in fluidic communication with the outside world, and a second end 22b, in fluidic communication with the empty space 24 above the membrane 12.

Through the same fourth etching mask, etching (first of the metal region 20 and of the conductive layer 15, and then of the sacrificial layer 14) leads to formation of a separation opening 29, which traverses the entire thickness of the metal region 20, of the conductive layer 15, and of the sacrificial layer 14 until the top surface 2a of the substrate 2 is reached.

The separation opening 29 is set in a position intermediate between the positions previously assumed by the aforesaid first and second pad trenches 16, 18 and defines: starting from the conductive layer 15, a plate region 30, overlying the empty space 24 and the membrane 12; and moreover, starting from the metal region 20, two distinct pads 30a, 30b, and in particular a first pad 30a, set in contact with the substrate 2, inside what constituted the second pad trench 18, and a second pad 30b, set in contact with the plate region 30, inside what constituted the first pad trench 16.

The manufacturing process terminates with a step of sawing of the wafer 1, for separating a plurality of dies 32, each die 32 comprising a body of semiconductor material 34 (constituted by a monolithic portion of the substrate 2 deriving from sawing of the wafer 1), in which the micromechanical structure, designated as a whole by 35, of the MEMS pressure sensor is integrated.

Figure 10:
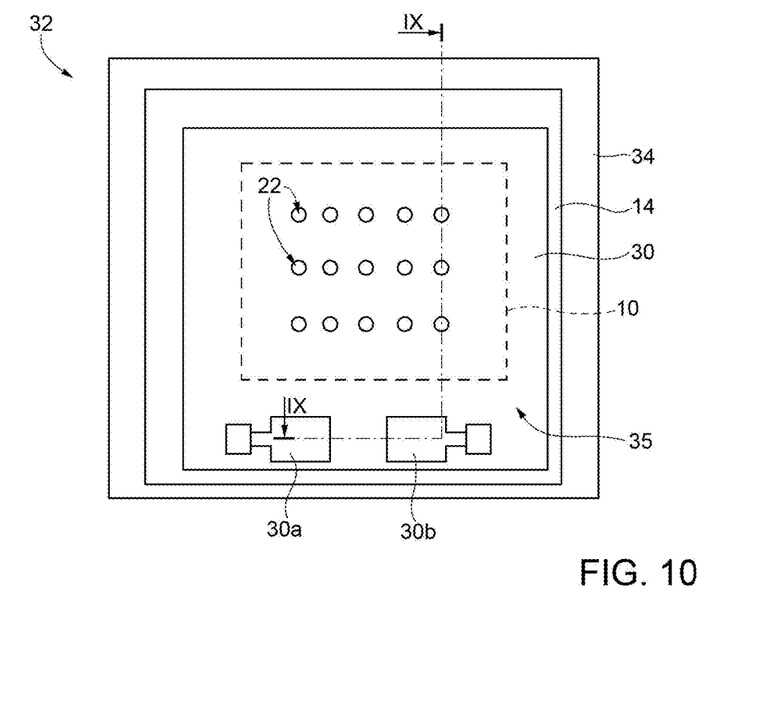
FIG. 10 is a schematic top plan view of the micromechanical structure of FIG. 9.

FIG. 10 is a schematic top plan view of the same micromechanical structure 35, at the end of the manufacturing process; this top plan view shows in particular the lattice (or array) arrangement of the holes 22 made through the plate region 30.

In detail, the micromechanical structure 35 thus comprises: the buried cavity 10, completely contained within the body made semiconductor material 34, and the membrane 12, which is set above the buried cavity 10 and separates the same buried cavity 10 from the top surface 2a of the body of semiconductor material 34; the empty space 24, above the membrane 12, which enables deformation thereof in the presence of incident pressure waves; the plate region 30, set vertically above the membrane 12, from which it is separated by the empty space 24, with the corresponding holes 22 that set the same empty space 24 (and the membrane 12) in communication with the environment external to the MEMS pressure sensor and hence enable entry of the aforesaid pressure waves; and moreover the first pad 30a, which electrically contacts the body of semiconductor material 34 (and hence the membrane 12), and the second pad 30b, which electrically contacts the plate region 30.

In particular, the micromechanical structure 35 defines a sensing capacitor C (shown schematically in FIG. 9) having, as a first plate or electrode, the plate region 30 (hence constituted by an epitaxial polysilicon region released from the underlying substrate), and, as second plate, the membrane 12, the first and second plates being separated by the empty space 24 (which constitutes the dielectric of the sensing capacitor C).

During operation, the pressure exerted by the external environment on the membrane 12 causes deformation thereof and a capacitance variation of the sensing capacitor C. This capacitance variation may be detected through electrical connection to the first and second pads 30a, 30b, for example, by an appropriate ASIC of the MEMS pressure sensor, designed to receive the capacitance variation and process it appropriately (for example, by amplification and filtering operations) for supplying a sensing signal indicative of the value of detected pressure.

Figure 11:
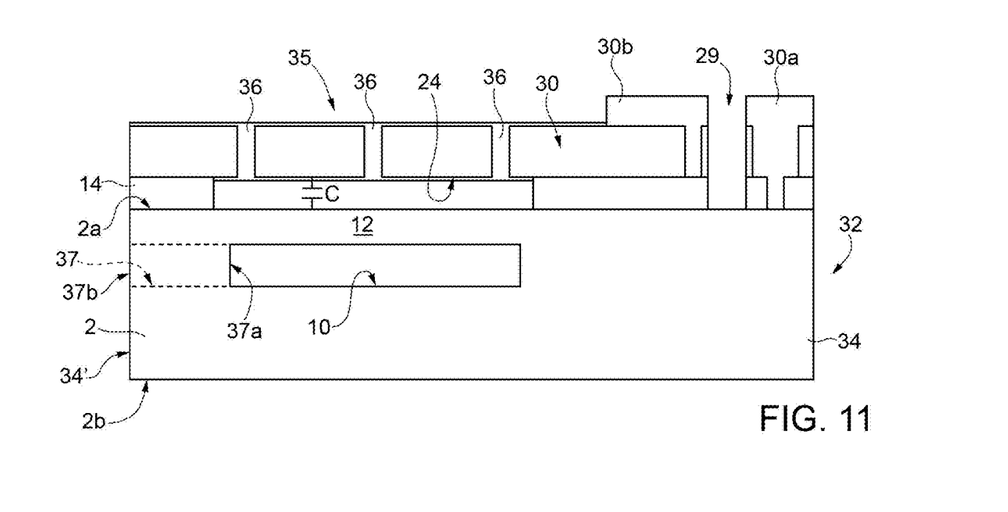
FIG. 11 is a schematic cross-sectional view of a micromechanical structure of a MEMS pressure sensor, according to a second embodiment of the present solution, in a final step of a corresponding manufacturing process.
Figure 12:
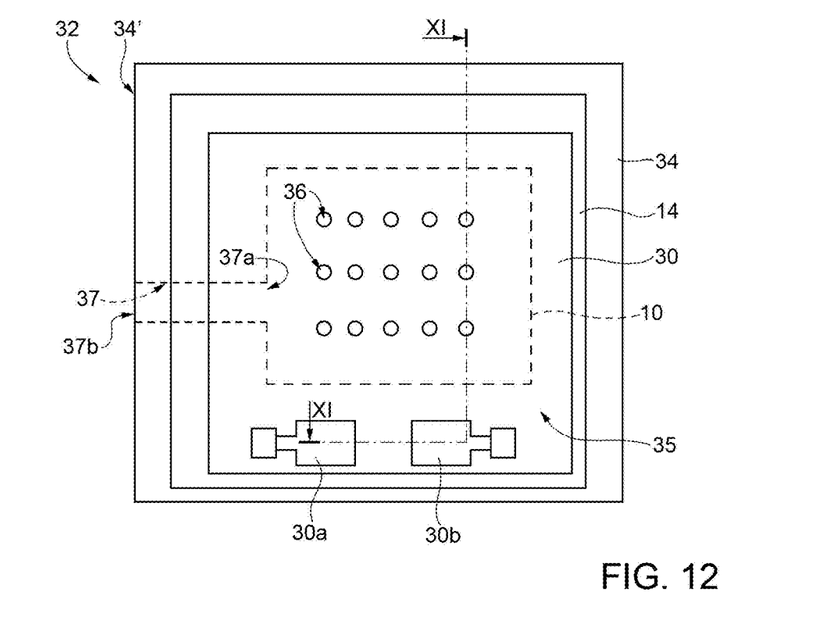
FIG. 12 is a schematic top plan view of the micromechanical structure of FIG. 11.

With reference to FIGS. 11 and 12, a second embodiment of the MEMS capacitive pressure sensor is now described.

In this second embodiment, the plate region 30 does not have holes 22 for setting the membrane 12 in fluidic communication with the external environment; the same plate region 30 is indeed constituted by a solid region without any openings.

In other words, the empty space 24 is in this case isolated from the external environment, closed between the plate region 30, at the top, and the membrane 12, at the bottom (being moreover delimited laterally by the portions of the sacrificial layer 14, which remain after chemical etching for release of the plate region 30).

The present Applicant has in fact realized that, at least in some applications, it may be disadvantageous for the membrane 12 to be in direct communication with the external environment. It may in fact be useful to protect the membrane 12 from contaminants, impurities, and/or humidity.

The manufacturing process envisages, in this case, that the holes 22 (once again provided for release of the plate region 30 by removal via chemical etching of the underlying sacrificial layer 14) are afterwards filled by means of a step of thermal oxidation of the wafer 1, which leads to formation of a coating layer, designated by 36 in FIG. 11, on the exposed surfaces of the conductive layer 15. In particular, this coating layer 36 completely fills the holes 22.

In this second embodiment, fluidic communication of the membrane 12 with the environment external to the body of semiconductor material 34 of the micromechanical structure 35 is ensured by a buried access channel 37, which laterally connects up to the buried cavity 10 within the body of semiconductor material 34.

In particular, the buried access channel 37 extends at a depth, parallel to the top surface of the body of semiconductor material 34, and has a first opening 37a in fluidic communication with the buried cavity 10 and a second opening 37b that gives out onto the external environment at a side wall 34' of the body of semiconductor material 34 (this side wall 34' extending transverse to the front and rear surfaces of the body of semiconductor material 34).

The buried access channel 37 is formed with the same process steps that lead to formation of the buried cavity 10.

In particular, the mask 3 (described previously with reference to FIGS. 2a and 2b) has in this case a lateral prolongation having the desired conformation for the buried access channel 37, and moreover the step of sawing of the wafer 1 is carried out in such a way that the scribe lines define the aforesaid second opening 37b of the buried access channel 37, so as to open the buried access channel 37 onto the external environment.

In this second embodiment, the pressure waves hence enter the buried access channel 37 from the second opening 37b and impinge upon an internal surface of the membrane 12, set in contact with the buried cavity 10, causing deformation thereof and capacitive variation of the sensing capacitor C (which is, apart from this difference, formed in a way altogether similar to what has been described for the first embodiment).

Figure 13:
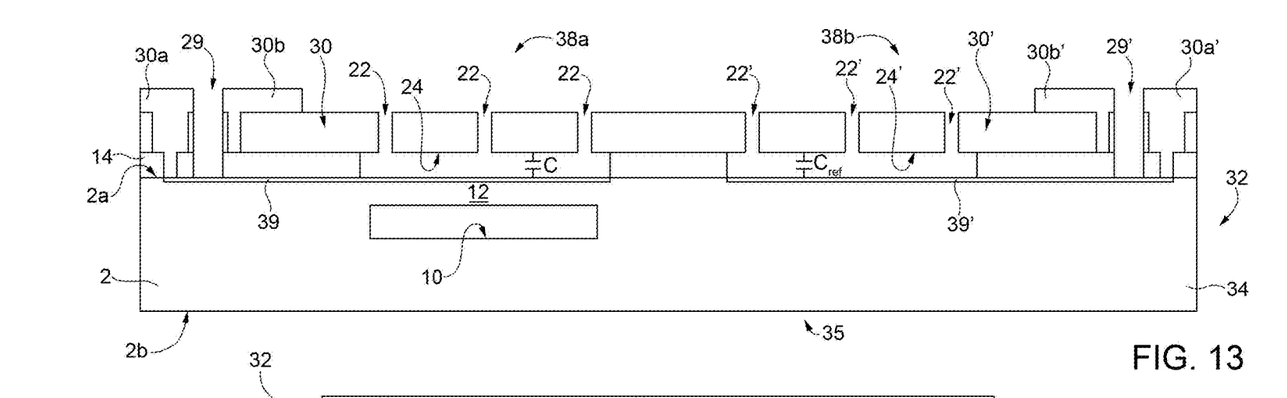
FIG. 13 is a schematic cross-sectional view of a micromechanical structure of a MEMS pressure sensor, according to a third embodiment of the present solution, in a final step of a corresponding manufacturing process.
Figure 14:
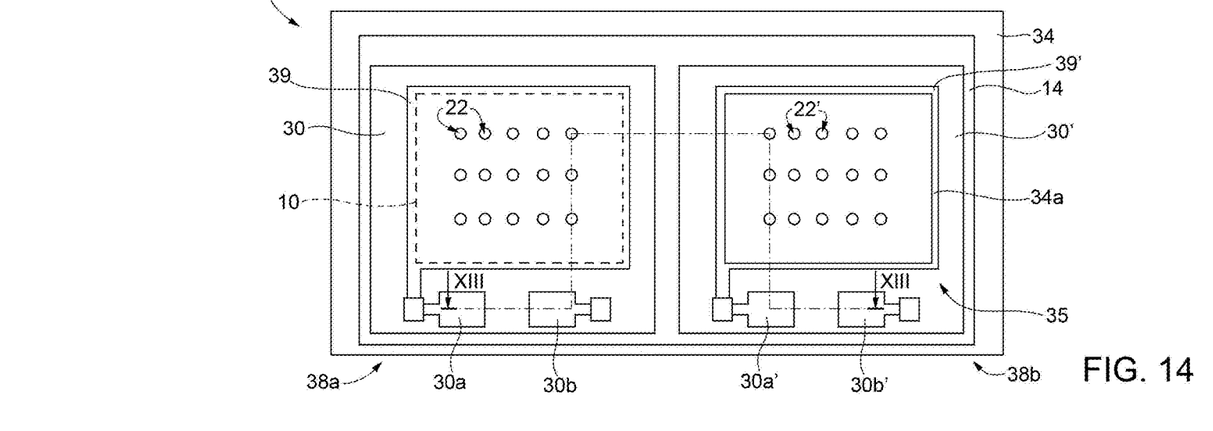
FIG. 14 is a schematic top plan view of the micromechanical structure of FIG. 13.

With reference to FIGS. 13 and 14, a third embodiment of the MEMS pressure sensor of a capacitive type is now described.

In this third embodiment, the micromechanical structure 32 comprises a reference structure, integrated in the same body of semiconductor material 34 where the structure for detecting the pressure of the external environment is formed; the reference structure is designed to allow pressure detection of a differential type (i.e., with respect to a known pressure reference, having characteristics of invariability with respect to the pressure to be detected).

In the third embodiment, the pressure-sensing structure, designated by 38a, is provided in a way altogether similar to the micromechanical structure 35 discussed in detail previously with reference to FIGS. 9 and 10 (i.e., it has the holes 22 through the plate region 30 to put the membrane 12 in fluidic communication with the outside world).

The reference structure, designated by 38b, comprises a micromechanical structure, which is also altogether similar to the micromechanical structure 35, except for the fact that it does not comprise the buried cavity 10 and the membrane 12.

In particular, this reference structure 38b comprises: a respective plate region 30', made of conductive material, suspended above a surface portion 34a of the body of semiconductor material 34 set laterally with respect to the membrane 12 of the sensing structure 38a, and separated from the same surface portion 34a by a respective empty space 24'; a plurality of respective holes 22' through the respective plate region 30' for fluidic communication of the respective empty space 24' with the external environment; and respective pads 30a', 30b', for electrical connection, from outside, of the aforesaid surface portion 34a and of the respective plate region 30', which form the plates of a reference capacitor $C_{ref}$.

The value of capacitance of the reference capacitor $C_{ref}$ is hence not affected by the pressure to be detected (in so far as the surface portion 34a of the body of semiconductor material 34 does not undergo deformation as a function of this pressure), and is instead affected by the same phenomena of disturbance that afflict the sensing structure 38a, for example, in the presence of humidity.

The corresponding manufacturing process hence envisages altogether similar process steps (carried out simultaneously) for providing the sensing structure 38a and the reference structure 38b, except for the absence of the initial steps of formation of a buried cavity for the reference structure 38b.

The ASIC associated to the micromechanical structures receives in this case the capacitive variations both of the sensing capacitor C and of the reference capacitor $C_{ref}$ by means of the first and second pads 30a, 30b of the sensing structure 38a, and by means of similar first and second pads 30a', 30b' of the reference structure 38b.

The ASIC advantageously processes these capacitive variations of the sensing capacitor C and of the reference capacitor $C_{ref}$ in a differential way so as to eliminate the effects of the disturbance, for example, due to humidity, on the detected pressure value.

As shown in FIG. 13, a doped region 39, 39' may moreover be present both in the sensing structure 38a and in the reference structure 38b, in a surface portion of the body of semiconductor material 34 underneath the empty space 24, 24' (set in a position corresponding to the membrane 12, for the sensing structure 35a, and forming a surface portion of the same membrane 12).

The doped region 39, 39' may be formed by implantation or diffusion of dopants through a dedicated mask, following upon formation of the buried cavity 10, and in this case contributes to constituting the second plate of the sensing capacitor C and reference capacitor $C_{ref}$; advantageously, the presence of this doped region 39, 39' enables increase of the conductivity of the aforesaid second plate and improves the sensing characteristics.

The advantages of the solution described emerge clearly from the foregoing description.

In particular, in at least one embodiment the MEMS pressure sensor, which is based upon the principle of capacitive detection, has a variability and a non-linearity with respect to temperature, that are much lower than those of known solutions, based on the piezoresistive sensing principle.

Figure 15:
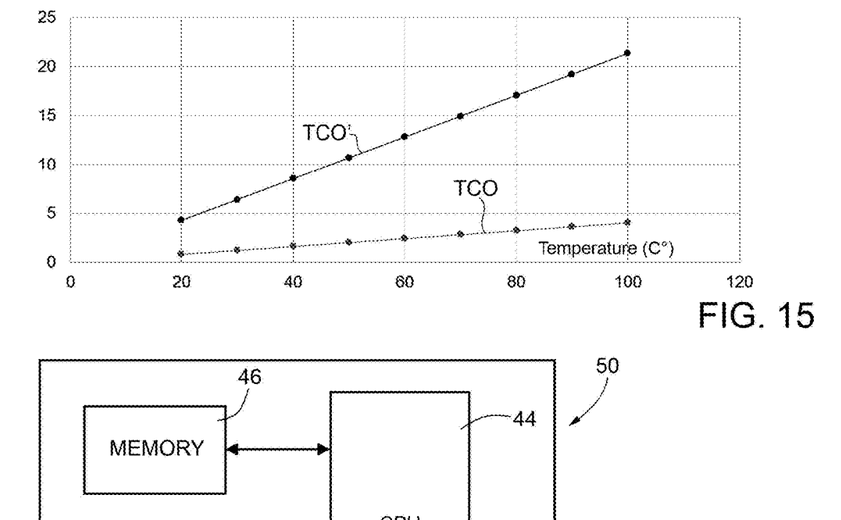
FIG. 15 shows a graph that compares the plot of the temperature coefficient of a MEMS pressure sensor according to the present solution with that of a piezoresistive pressure sensor of a known type.

In this regard, FIG. 15 compares the plot of the thermal coefficient TCO (expressed as percentage of the full scale FS) of the pressure sensor according to the present solution, of a capacitive type, with the temperature coefficient TCO' of a known pressure sensor, of a piezoresistive type.

From a comparison of the plots, the higher stability in temperature of the MEMS pressure sensor according to the present solution is evident, as likewise the greater linearity of its response.

In particular, the present Applicant has found for the MEMS pressure sensor according to the present solution a temperature coefficient TCO of 0.4 mbar/° C. (i.e., 0.04% FS/° C.) as against a temperature coefficient TCO' of 2 mbar/° C. (i.e., 0.2% FS/° C.) for the known pressure sensor.

The process for manufacturing the MEMS pressure sensor according to the present solution is advantageously less complex and less costly than that of pressure sensors of a known type, in particular of a piezoresistive type, due to, for example, to the absence of masks dedicated to the processes of diffusion of the corresponding piezoresistive elements.

In particular, the present Applicant has noted a reduction of the number of masks utilized by the manufacturing process, which may, for example, be only five in the embodiments described (four etching masks and one deposition mask), as against processes for manufacturing piezoresistive pressure sensors, which utilizes, for example, nine masks.

Furthermore, one or more embodiments of the solution described advantageously enables a simple and effective implementation of self-test operations in the MEMS pressure sensor, for example, by applying from outside appropriate electrical biasing signals to the plates of the sensing capacitor C by means of the first and second pads 30a, 30b. The aforesaid characteristic is particularly advantageous, as highlighted previously, for example, for applications in the automotive field.

Figures 16, 17:
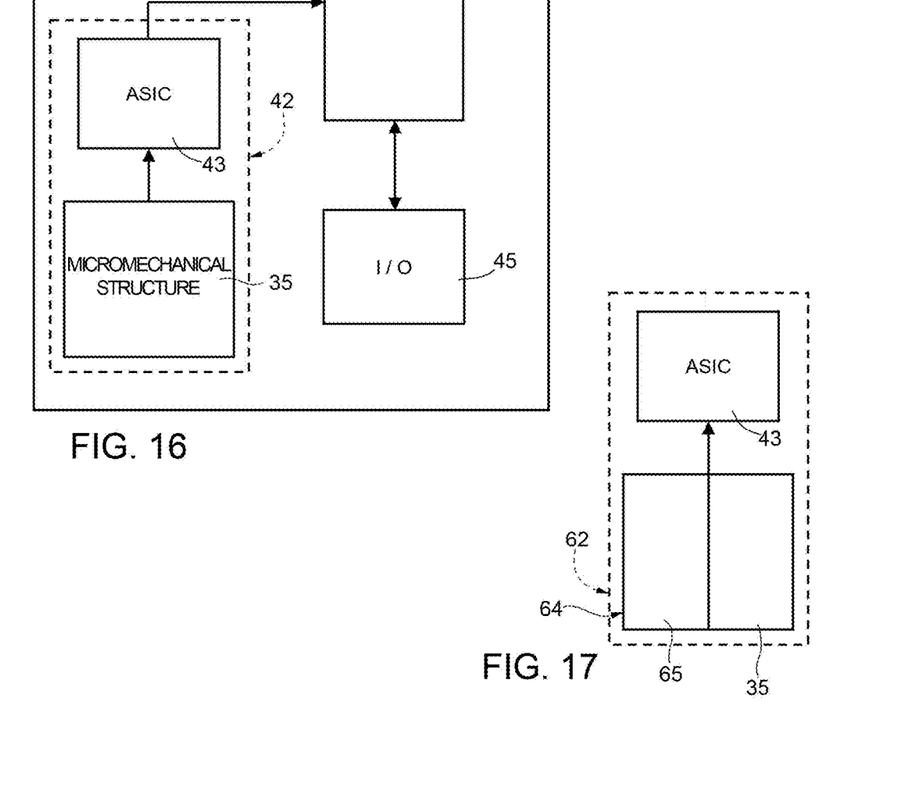
FIG. 16 is a general block diagram of an electronic device incorporating the MEMS pressure sensor, according to a further aspect of the present solution.
FIG. 17 is a general block diagram of a variant embodiment of the MEMS pressure sensor.

In general, the aforesaid characteristics render use of the MEMS pressure sensor in an electronic device 50 particularly advantageous, for example, for barometric applications in the automotive field, as shown schematically in FIG. 16.

In particular, in FIG. 16, the MEMS pressure sensor is designated by 42, including the micromechanical structure 35 described previously and an ASIC 43, which provides the corresponding reading interface (and may be provided in the same die 32 as that of the micromechanical structure 35, or in a different die, which may in any case be housed in one and the same package).

The electronic device 50 is generally able to process, store, and/or transmit and receive signals and information, and comprises: a microprocessor 44, which receives the signals detected by the MEMS pressure sensor 42; an input/output interface 45 connected to the microprocessor 44; and an internal memory 46, of a non-volatile type.

The electronic device 50, when used in the automotive field, may, for example, control the air/fuel mixture for combustion in the engine, or else control opening of an airbag, as a function the detected pressure value.

Finally, it is clear that modifications and variations may be made to what has been described and illustrated herein, without thereby departing from the scope of the present disclosure.

In particular, it is evident that modifications may be made to the materials used for manufacturing the MEMS pressure sensor 42, it being possible, for example, for a different metal material to be used for providing the pads 30a, 30b, or else a different dielectric material for providing the sacrificial layer 14.

In addition, it is evident that the MEMS pressure sensor 42 may advantageously be used also for different applications, where it is desired to obtain a detection of pressure with characteristics of independence from temperature, for example, in portable or wearable devices (such as smartphones, tablets, smartwatches, or the like), or in industrial applications, where high temperatures are reached (for example, in the range from −40° C. to 175° C.).

Moreover, the MEMS pressure sensor may advantageously be integrated with further MEMS inertial sensors and/or microphones, due to the compatibility of the manufacturing process used.

In this regard, FIG. 17 is a schematic illustration of a combined MEMS sensor, designated by 62, including a micromechanical sensing structure of a combined type, designated by 64, which integrates, advantageously in one and the same body of semiconductor material, the micromechanical structure 35 described previously in detail for pressure detection, and moreover a further micromechanical sensing structure 65, of a known type, for example, for detecting an acceleration, an angular velocity, or acoustic waves. The micromechanical structures 35, 65 are advantageously made with altogether compatible manufacturing processes.

The combined MEMS sensor 62 further comprises an ASIC, once again designated by 43, operatively coupled both to the micromechanical structure 35 and to the further micromechanical sensing structure 65, in order to provide a combined sensing structure (i.e., an accelerometer, a gyroscope, or a microphone, combined with the pressure sensor).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a MEMS pressure sensor, the process comprising:
    forming a buried cavity in a substrate of semiconductor material, the buried cavity forming a membrane that is suspended above the buried cavity;
    forming, suspended above the membrane, a plate region made of conductive material and separated from the membrane by an empty space;
    forming a fluidic-communication access channel providing fluidic communication between the membrane and an external environment, wherein forming the fluidic-communication access channel occurs simultaneously with forming the buried cavity; and
    forming electrical-contact elements electrically coupled to the membrane and the plate region, wherein the membrane and the plate region form plates of a sensing capacitor.

2. The process according to claim 1, wherein said step of forming the buried cavity comprises:
    forming within the substrate, at a top surface, trenches that are delimited by columns of the substrate;
    epitaxially growing, at the columns, a closing layer of semiconductor material, the closing layer closing the trenches at a top portion of the trenches; and
    carrying out a thermal treatment that causes migration of the semiconductor material of the columns towards the closing layer to form the buried cavity and the membrane suspended above the buried cavity.

3. The process according to claim 1, wherein forming the plate region comprises, after forming the buried cavity, and comprises the steps of:
    forming a sacrificial layer on a top surface of the substrate;
    forming a conductive layer on the sacrificial layer;
    forming a plurality of through holes in the conductive layer; and
    partially removing the sacrificial layer through the plurality of through holes and releasing a portion of the conductive layer with respect to the substrate, wherein partially removing the sacrificial layer forms the plate region and the empty space above the membrane.

4. The process according to claim 3, wherein forming a conductive layer comprises epitaxially growing the conductive layer on the sacrificial layer; and wherein the conductive layer comprises polysilicon.

5. The process according to claim 3, wherein forming the fluidic-communication access channel comprises forming the plurality of holes through the conductive layer, the plurality of through holes having first ends in fluidic communication with the external environment and second ends in fluidic communication with the empty space above the membrane.

6. The process according to claim 3, further comprising filling the plurality of through holes with a filler layer; and wherein forming a fluidic-communication access channel comprises:
    forming a buried access channel that is contained within the substrate at a distance from the top surface and has a first opening in fluidic communication with the buried cavity; and
    wherein the substrate is a wafer, and wherein forming the buried cavity in the substrate of semiconductor material comprises forming a plurality of buried cavities in the wafer, the plurality of buried cavities forming membranes that are suspended above respective buried cavities, the process further comprising sawing the wafer into plurality of dies, each die comprising a buried cavity and a membrane.

7. The process according to claim 3, wherein forming electrical-contact elements comprises:
    forming a first contact trench through the conductive layer until the sacrificial layer is reached;
    forming a second contact trench through the conductive layer and the sacrificial layer until the top surface of the substrate is reached;

forming a conductive region above the conductive layer and within the first contact trench and the second contact trench; and defining, by etching, the conductive region and forming a first electrical-contact element, for electrical connection, from outside, of the membrane, and a second electrical-contact element, for electrical connection, from outside, of the plate region.

8. The process according to claim 1, wherein the sensing capacitor is a first sensing capacitor, the process further comprising forming a reference sensing capacitor in the substrate.

9. The sensor according to claim 1, comprising a doped region in a surface portion of the body.

10. A MEMS pressure sensor comprising:
a body including semiconductor material and having a first surface;
a buried cavity contained within the body and separated from the first surface by a membrane, wherein the membrane is suspended above the buried cavity;
a buried fluidic-communication access channel located within the body at a distance from the first surface and having an end at a lateral side surface, the buried fluidic-communication access channel configured to provide fluidic communication between the membrane and an external environment;
a plate region made of conductive material, the plate region suspended above the membrane and separated from the membrane by an empty space; and
first and second electrical-contact elements configured to provide electrical connection to the membrane and the plate region, respectively, wherein the membrane and the plate region form a sensing capacitor.

11. The sensor according to claim 10, wherein the plate region comprises a layer of epitaxial polysilicon grown above the first surface of the body.

12. The sensor according to claim 10, wherein the buried fluidic-communication access channel is a plurality of through holes in the plate region, the plurality of through holes having first ends in fluidic communication with the external environment and second ends in fluidic communication with the empty space above the membrane.

13. The sensor according to claim 10, wherein, the buried access channel having a first opening in fluidic communication with the buried cavity and a second opening at an outer side wall of the body at the external environment.

14. The sensor according to claim 10, wherein the first electrical-contact element is electrically coupled to the membrane and the second electrical-contact element is electrically connected to the plate region, the first electrical-contact element and the second electrical-contact element being separated from each other by a separation trench.

15. The sensor according to claim 10, further comprising a reference structure in the body.

16. The sensor according to claim 15, wherein the plate region is a first plate region, wherein the buried fluidic-communication access channel is a first buried fluidic-communication access channel, and the empty space is a first empty space, wherein the reference structure comprises:
a second plate region made of conductive material, the second plate region suspended above a surface portion of the body and set laterally with respect to the membrane, the second plate region being separated from the surface portion by a second empty space;
a second buried fluidic-communication access channel configured to provide fluidic communication between the second empty space and the external environment; and
reference electrical-contact elements configured to provide electrical communication to the surface portion and the second plate region, wherein the second plate region and the surface portion of the body form the plates of a reference capacitor.

17. An electronic device comprising:
an ASIC; and
a MEMS pressure sensor coupled to the ASIC, the MEMS pressure sensor including:
a body including semiconductor material;
a buried cavity contained within the body;
a membrane suspended over the buried cavity;
a buried fluid access channel fluidically coupling the membrane with an external environment the buried fluid access channel having a first opening in fluidic communication with the buried cavity and a second opening at an outer sidewall of the body;
a plate region suspended above the membrane and separated by the membrane by an empty space, the plate region being made of conductive material;
a first electrical-contact element coupled to the membrane; and
a second electrical-contact element coupled to the plate region, wherein the membrane and the plate region form a sensing capacitor.

18. The electronic device according to claim 17, wherein the electronic device is at least one of a smartphone, a tablet, a wearable device, and a smartwatch.

* * * * *

UNITED STATES PATENT AND TRADEMARK OFFICE
CERTIFICATE OF CORRECTION

PATENT NO. : 10,048,148 B2  
APPLICATION NO. : 15/276617  
DATED : August 14, 2018  
INVENTOR(S) : Lorenzo Baldo et al.

Page 1 of 1

It is certified that error appears in the above-identified patent and that said Letters Patent is hereby corrected as shown below:

In the Claims

Column 12, Line 33, Claim 17:
"external environment the" should read, --external environment, the--.

Signed and Sealed this
Thirtieth Day of April, 2019

Andrei Iancu
*Director of the United States Patent and Trademark Office*